United States Patent
Li

(10) Patent No.: US 12,094,890 B2
(45) Date of Patent: Sep. 17, 2024

(54) SENSOR MODULE, METHOD FOR MANUFACTURING SAME, AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Jinming Li, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 802 days.

(21) Appl. No.: 17/252,274

(22) PCT Filed: Oct. 22, 2020

(86) PCT No.: PCT/CN2020/122923
§ 371 (c)(1),
(2) Date: Dec. 15, 2020

(87) PCT Pub. No.: WO2022/047918
PCT Pub. Date: Mar. 10, 2022

(65) Prior Publication Data
US 2022/0320153 A1    Oct. 6, 2022

(30) Foreign Application Priority Data
Sep. 4, 2020    (CN) .......................... 202010919067.0

(51) Int. Cl.
*H01L 27/144*          (2006.01)

(52) U.S. Cl.
CPC .............................. *H01L 27/1443* (2013.01)

(58) Field of Classification Search
CPC ............. H01L 27/1443; H01L 27/1461; H01L 27/14612; H01L 27/14614; H01L 27/14643; H01L 27/14692
See application file for complete search history.

(56) References Cited

U.S. PATENT DOCUMENTS

2010/0315580 A1    12/2010   Cho
2018/0150668 A1*    5/2018   Li .................... H01L 29/78669

FOREIGN PATENT DOCUMENTS

CN             1894798 A       1/2007
CN           101409258 A       4/2009
(Continued)

OTHER PUBLICATIONS

Chinese Office Action issued in corresponding Chinese Patent Application No. 202010919067.0 dated Dec. 15, 2022, pp. 1-7.
(Continued)

*Primary Examiner* — Timor Karimy
(74) *Attorney, Agent, or Firm* — PV IP PC; Wei Te Chung

(57) ABSTRACT

The present application provides a sensor module, a method for manufacturing the sensor module, and a display panel. The sensor module is integrated by a light-sensitive PN junction and a bottom-gate thin film transistor, a limitation of an integration of top-gate thin film transistor photosensitive sensor is prevented, and a problem of increased thickness and development cost in an integration of a photosensitive sensor on a bottom surface and the display panel is solved.

15 Claims, 9 Drawing Sheets

(56) References Cited

FOREIGN PATENT DOCUMENTS

| CN | 102324445 A | 1/2012 |
|----|-------------|--------|
| CN | 102354695 A | 2/2012 |
| CN | 103413817 A | 11/2013 |
| CN | 104037179 A | 9/2014 |
| CN | 105550662 A | 5/2016 |
| CN | 105956584 A | 9/2016 |
| CN | 108470739 A | 8/2018 |
| CN | 209592040 U | 11/2019 |
| JP | H05136386 A | 6/1993 |

OTHER PUBLICATIONS

International Search Report in International application No. PCT/CN2020/122923, mailed on May 27, 2021.
Written Opinion of the International Search Authority in International application No. PCT/CN2020/122923, mailed on May 27, 2021.

\* cited by examiner

SENSOR MODULE, METHOD FOR MANUFACTURING SAME, AND DISPLAY PANEL

RELATED APPLICATIONS

This application is a Notional Phase of PCT Patent Application No. PCT/CN2020/122923 having international filing date of Oct. 22, 2020, which claims the benefit of priority of Chinese Patent Application No. 202010919067.0 filed on Sep. 4, 2020. The contents of the above applications are all incorporated by reference as if fully set forth herein in their entirety.

BACKGROUND OF INVENTION

Field of Invention

The present application relates to the field of display technology, and particularly to a sensor module, a method for manufacturing the sensor module, and a display panel.

Description of Prior Art

Under low light conditions, top-gate thin film transistor photosensitive sensor (top-gate TFT sensor) has significantly better photosensitivity in an off-state current (Ioff) section than a conventional back-channel etch (BCE, back channel etch) thin film transistor photosensitive sensor. This is mainly due to an increase in illuminated area of an active layer. However, there are limitations when a bottom-illuminated sensor is integrated with a display panel (display), and can be only be integrated with a color filter (CF) substrate of a liquid crystal display (LCD) or with a cover of an active display, thereby not only increasing a thickness of module, but also increasing development cost.

SUMMARY OF INVENTION

The present application provides a sensor module, a method for manufacturing the sensor module, and a display panel, the sensor module is integrated with a bottom-gate structure thin film transistor and a photosensitive PN junction. When the sensor module is applied to the photosensitive display panel, the increase in the thickness of the display panel can be prevented, and the development cost can be reduced.

The present application provides a sensor module including:
  a substrate, wherein the substrate includes a first surface and a second surface opposite to each other;
  a gate electrode layer, wherein the gate electrode layer partly covers the first surface, the gate electrode layer includes a first portion and a second portion, the first portion includes a connecting portion and at least two sub gate electrode layers, spaces are defined between the sub gate electrode layers, an end of the sub gate electrode layer is connected to the connecting portion;
  a first semiconductor layer, wherein the first semiconductor layer is disposed on a side of the first portion away from the first surface and insets into the spaces;
  a first source and drain electrode layer, wherein the first source and drain electrode layer is disposed on a side of the first semiconductor layer away from the first electrode layer; and the first portion, the first semiconductor layer and the first source and drain electrode layer are combined to form a light-sensitive PN junction;
  a thin film transistor, wherein the thin film transistor and the light-sensitive PN junction are disposed on the first surface and adjacent to each other, the second portion is the gate electrode of the thin film transistor.

In some embodiments, the first source and drain electrode layer includes a first P-type material layer and a first electrode material layer, the first P-type material layer is disposed on a side near the first semiconductor layer, the first electrode material layer is disposed on a side away from the first semiconductor layer, the first P-type material layer is made of one or a group selected from molybdenum oxide and tin oxide, and the first electrode material layer is made of metal or metal oxide.

In some embodiments, a thickness of the first source and drain electrode layer ranges from 300 Å to 800 Å.

In some embodiments, the first source and drain electrode layer is disposed in an orthographic projection region of the first semiconductor layer projected on the first surface, and a covered area of the first source and drain electrode layer is less than a covered area of the first semiconductor layer.

In some embodiments, the gate electrode layer is made of metal or metal alloy, and a thickness of the gate electrode layer ranges from 3000 Å to 8000 Å.

In some embodiments, the first semiconductor layer is made of transparent metal oxide, and a thickness of the first semiconductor layer ranges from 300 Å to 800 Å.

In some embodiments, the thin film transistor further includes a gate electrode insulating layer, a second semiconductor layer, and a second source and drain electrode layer, the gate electrode insulating layer is disposed on a side of the second portion away from the first surface and extends to the first surface, the second semiconductor layer partly covers a side of the gate electrode insulating layer away from the second portion, the second source and drain electrode layer partly covers a side of the second semiconductor layer away from the gate electrode insulating layer and extends to the gate electrode insulating layer, and a first through hole is defined in the second source and drain electrode layer covering the second semiconductor layer.

In some embodiments, the second source and drain electrode layer includes a second P-type material layer and a second electrode material layer, the second P-type material layer is disposed on a side near the second semiconductor layer, and the second electrode material layer is disposed on a side away from the second semiconductor layer.

In some embodiments, the sensor module further includes a passivation layer and a pixel electrode layer, the passivation layer covers the light-sensitive PN junction and the thin film transistor, and extends to the first surface, the passivation layer is connected to the second semiconductor layer by the first through hole, a second through hole is defined in the passivation layer, the pixel electrode layer partly covers a side of the passivation layer away from the first surface, and is connected to the second source and drain electrode layer by the second through hole.

The present application provides a method for manufacturing a sensor module including:
  providing a substrate, wherein the substrate includes a first surface and a second surface opposite to each other;
  disposing a gate electrode layer on the first surface, wherein the gate electrode layer partly covers the first surface, the gate electrode layer includes a first portion and a second portion, the first portion includes a connecting portion and at least two sub gate electrode layers, spaces are defined between the sub gate electrode layers, an end of the sub gate electrode layer is connected to the connecting portion;

disposing a first semiconductor layer on a side of the first portion away from the first surface, wherein the first semiconductor layer insets into the spaces;

disposing a first source and drain electrode layer on a side of the first semiconductor layer away from the gate electrode layer;

combining the first portion, the first semiconductor layer and the first source and drain electrode layer to form a light-sensitive PN junction; and disposing a thin film transistor on the first surface and adjacent to the light-sensitive PN junction, wherein the second portion is the gate electrode of the thin film transistor.

In some embodiments, the step of disposing the gate electrode layer on the first surface includes:

forming a gate electrode film layer on the first surface by a deposition process;

employing a yellow light process and an etching process to the gate electrode film layer to form at least two sub gate electrode layer comprising spaces, a connecting portion and a patterned gate electrode film layer, wherein an end of the sub gate electrode layer is connected to the connecting portion, the sub gate electrode layer and the connecting portion are combined to form a first portion, the patterned gate electrode film layer forms a second portion; and combining the first portion and the second portion to form the gate electrode layer.

In some embodiments, the step of disposing the thin film transistor on the first surface and adjacent to the light-sensitive PN junction includes:

disposing a gate electrode insulating layer on a side of the second portion away from the first surface, wherein the gate electrode insulating layer extends to the first surface;

when the first semiconductor layer is disposed on the side of the first portion away from the first surface, a second semiconductor layer is disposed on a side of the gate electrode insulating layer away from the second portion;

when the first source and drain electrode layer is disposed on the side of the first semiconductor layer away from the gate electrode layer, the second source and drain electrode layer is disposed on a side of the second semiconductor layer away from the gate electrode insulating layer, and the second source and drain electrode layer extends to the gate electrode insulating layer; and combining the second portion, the gate electrode insulating layer, the second semiconductor layer and the second source and drain electrode layer to form the thin film transistor.

The present application provides a display panel including a sensor module, wherein the sensor module includes:

a substrate, wherein the substrate includes a first surface and a second surface opposite to each other;

a gate electrode layer, wherein the gate electrode layer partly covers the first surface, the gate electrode layer includes a first portion and a second portion, the first portion includes a connecting portion and at least two sub gate electrode layers, spaces are defined between the sub gate electrode layers, an end of the sub gate electrode layer is connected to the connecting portion;

a first semiconductor layer, wherein the first semiconductor layer is disposed on a side of the first portion away from the first surface and insets into the spaces;

a first source and drain electrode layer, wherein the first source and drain electrode layer is disposed on a side of the first semiconductor layer away from the gate electrode layer; and the first portion, the first semiconductor layer and the first source and drain electrode layer are combined to form a light-sensitive PN junction;

a thin film transistor, wherein the thin film transistor and the light-sensitive PN junction are disposed on the first surface and adjacent to each other, the second portion is the gate electrode of the thin film transistor.

In some embodiments, the first source and drain electrode layer comprises a first P-type material layer and a first electrode material layer, the first P-type material layer is disposed on a side near the first semiconductor layer, the first electrode material layer is disposed on a side away from the first semiconductor layer, the first P-type material layer is made of one or a group selected from molybdenum oxide and tin oxide, and the first electrode material layer is made of metal or metal oxide.

In some embodiments, a thickness of the first source and drain electrode layer ranges from 300 Å to 800 Å.

In some embodiments, the first source and drain electrode layer is disposed in an orthographic projection region of the first semiconductor layer projected on the first surface, and a covered area of the first source and drain electrode layer is less than a covered area of the first semiconductor layer.

In some embodiments, the gate electrode layer is made of metal or metal alloy, and a thickness of the gate electrode layer ranges from 3000 Å to 8000 Å.

In some embodiments, the thin film transistor further comprises a gate electrode insulating layer, a second semiconductor layer, and a second source and drain electrode layer, the gate electrode insulating layer is disposed on a side of the second portion away from the first surface and extends to the first surface, the second semiconductor layer partly covers a side of the gate electrode insulating layer away from the second portion, the second source and drain electrode layer partly covers a side of the second semiconductor layer away from the gate electrode insulating layer and extends to the gate electrode insulating layer, and a first through hole is defined in the second source and drain electrode layer covering the second semiconductor layer.

In some embodiments, the second source and drain electrode layer comprises a second P-type material layer and a second electrode material layer, the second P-type material layer is disposed on a side near the second semiconductor layer, and the second electrode material layer is disposed on a side away from the second semiconductor layer.

In some embodiments, the sensor module further comprises a passivation layer and a pixel electrode layer, the passivation layer covers the light-sensitive PN junction and the thin film transistor, and extends to the first surface, the passivation layer is connected to the second semiconductor layer by the first through hole, a second through hole is defined in the passivation layer, the pixel electrode layer partly covers a side of the passivation layer away from the first surface, and is connected to the second source and drain electrode layer by the second through hole.

The technical effect of the present application is: the sensor module of the present application includes a substrate, a gate electrode layer, a first semiconductor layer, a first source and drain electrode layer, and a thin film transistor. The substrate includes a first surface and a second surface opposite to each other. The gate electrode layer partly covers the first surface, the gate electrode layer includes a first portion and a second portion, the first portion includes a connecting portion and at least two sub gate electrode layers, spaces are defined between the sub gate electrode layers, and an end of the sub gate electrode layer is connected to the connecting portion. The first semiconductor layer is disposed on a side of the first portion away from the first surface and insets into the spaces. The first source and drain electrode layer is disposed on a side of the first semiconductor layer away from the gate electrode layer; and the first portion, the first semiconductor layer, and the first source and drain electrode layer are combined to form a light-sensitive PN junction. The thin film transistor and the light-sensitive PN junction are disposed on the first surface and adjacent to each other, and the second portion is the gate electrode of the thin film transistor. The sensor module is integrated by the light-sensitive PN junction and the bottom-gate thin film transistor, the limitation of the integration of top-gate thin film transistor photosensitive sensor is prevented, and the problem of the increased thickness and development cost in the integration of the photosensitive sensor on the bottom surface and the display panel is solved.

BRIEF DESCRIPTION OF DRAWINGS

In order to more clearly describe the technical solutions of the present invention, the following will briefly introduce the accompanying drawings needed in the description of the embodiments. Obviously, the accompanying drawings in the following description are only some embodiments of the present invention. For those skilled in the art, without creative work, other drawings can be obtained based on these drawings.

DETAILED DESCRIPTION OF PREFERRED EMBODIMENTS

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application.

It should be noted that in the description of this application, the term "center", "longitudinal", "horizontal", "length", "width", "thickness", "upper", "down", "front", "back", "left", "right", "vertical", "horizontal", "top", "bottom", "inner", "outer", "clockwise", and "anticlockwise" indicates a location or position relations based on the location or position shown in the appended drawings, rather than instructions referred to in or implied devices or components must have a specific location, in a specific orientation structure and operation. Therefore, it cannot be interpreted as a restriction on this application.

The present application provides a sensor module, a method for manufacturing the sensor module, and a display panel. The sensor module is described in detail below.

Figure 1:
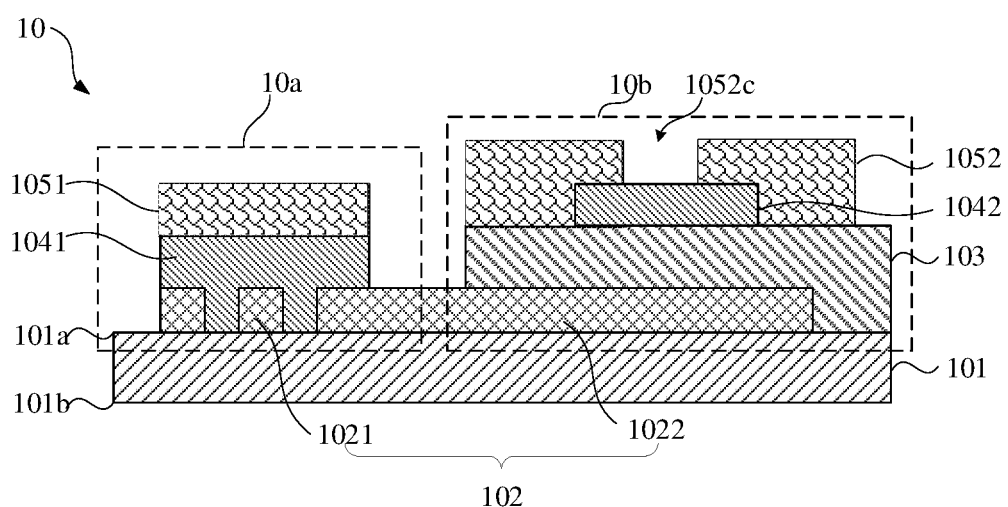
FIG. 1 is a first film layer structural schematic of a sensor module according to the present application.
Figure 2:
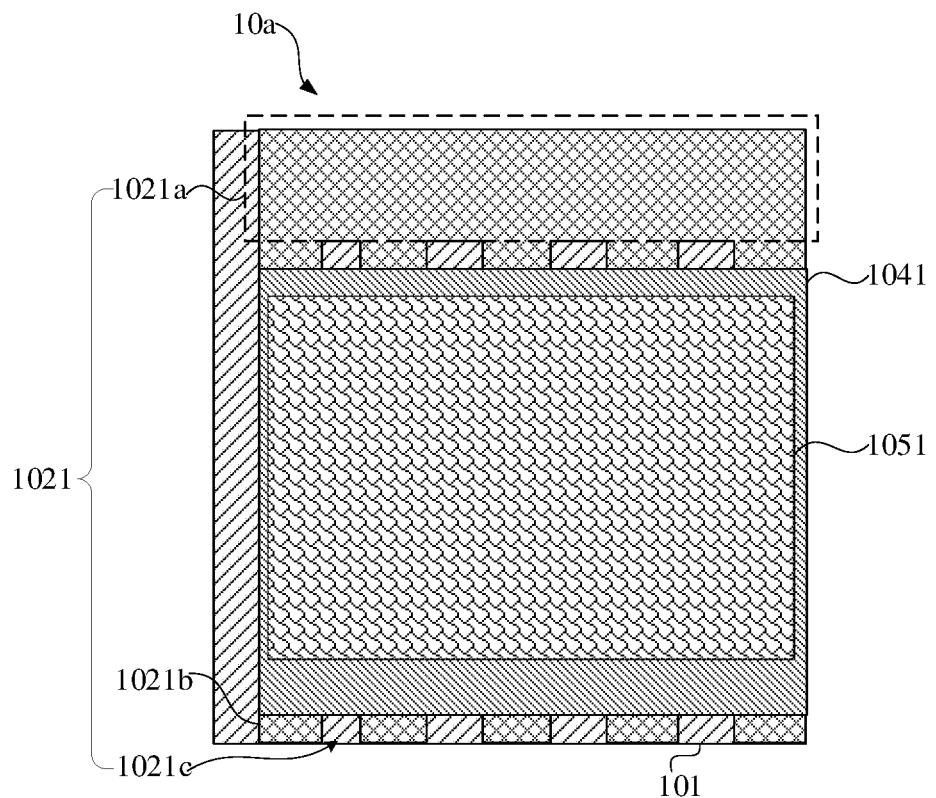
FIG. 2 is a top view structural schematic of a light-sensitive PN junction according to the present application.

Referring to FIG. 1 and FIG. 2, FIG. 1 is a first film layer structural schematic of a sensor module according to the present application, and FIG. 2 is a top view structural schematic of a light-sensitive PN junction according to the present application. The sensor module 10 includes a substrate 101, a gate electrode layer 102, a first semiconductor layer 1041, a first source and drain electrode layer 1051, and a thin film transistor 10b. The substrate 101 includes a first surface 101a and a second surface 101b opposite to each other. The gate electrode layer 102 partly covers the first surface 101a, the gate electrode layer 102 includes a first portion 1021 and a second portion 1022, the first portion 1021 includes a connecting portion 1021a and at least two sub gate electrode layers 1021b, spaces 1021c are defined between the sub gate electrode layers 1021b, and an end of the sub gate electrode layer 1021b is connected to the connecting portion 1021a. The first semiconductor layer 1041 is disposed on a side of the first portion 1021 away from the first surface 101a and insets into the spaces 1021c. The first source and drain electrode layer 1051 is disposed on a side of the first semiconductor layer 1041 away from the gate electrode layer 102. The first portion 1021, the first semiconductor layer 1041, and the first source and drain electrode layer 1051 are combined to form a light-sensitive PN junction 10a. The thin film transistor 10b and the light-sensitive PN junction 10a are disposed on the first surface 101a and adjacent to each other, and the second portion 1022 is the gate electrode of the thin film transistor 10b.

The present application develops a photosensitive sensor integrated with a bottom-gate structure TFT, which can prevent the problems of increasing module thickness and development cost when the top-gate structure photosensitive sensor is integrated in a display device. The present application adopts the structure of the light-sensitive PN junction to generate photodiodes (photocells), and the light generates electromotive force at both ends of the light-sensitive PN junction, which is equivalent to applying a forward voltage to both ends of the light-sensitive PN junction. Under the action of light, the current passes through the circuit structure to make the photosensitive PN junction 10a act as a photosensitive sensor.

It should be noted that the first surface 101a can be a top surface of the substrate 101, and the second surface 101b can be a bottom surface of the substrate 101. Of course, the first surface 101a can be the bottom surface of the substrate 101, and the second surface 101b can be the top surface of the substrate 101. Without special instructions in the present application, the default is that the first surface 101a is a top surface of the substrate 101, and the second surface 101b is a bottom surface of the substrate 101.

The gate electrode layer 102 is made of metal or metal alloy, specifically, which can be made of molybdenum (Mo), aluminum (Al), or molybdenum aluminum alloy. A thickness of the gate electrode layer 102 ranges from 3000 Å to 8000 Å. Specifically, the thickness of the gate electrode layer 102 is 3000 Å, 4000 Å, 5000 Å, 6000 Å, 7000 Å, or 8000 Å.

The first portion 1021 includes a connecting portion 1021a and at least two sub gate electrode layers 1021b, spaces 1021c are defined between the sub gate electrode layers 1021b, and an end of the sub gate electrode layer 1021b is connected to the connecting portion 1021a. That is, the first portion 1021 undergoes a hollow out process to form a comb structure shown in FIG. 2. This design can increase a light receiving area to improve the sensitivity of the light-sensitive PN junction 10a to light and increase light efficiency. Without the hollow out process, light cannot penetrate the gate electrode layer 102 and the first semiconductor layer 1041 to the light-sensitive PN junction 10a to form the electromotive force.

The first semiconductor layer 1041 is made of transparent metal oxide, specifically, which can be any one of indium gallium zinc oxide (IGZO), indium zinc tin oxide (IZTO), indium gallium zinc tin oxide (IGZTO), indium tin oxide (ITO), indium zinc oxide (IZO), indium aluminum zinc oxide (IAZO), indium gallium tin oxide (IGTO), and antimony tin oxide (ATO). The above materials have a good conductivity and transparency, and the thickness is small, and which will not affect the overall thickness of the display panel. At the same time, it can also reduce the harmful electron radiation and ultraviolet and infrared light to the human body. A thickness of the first semiconductor layer 1041 ranges from 300 Å to 800 Å, specifically, the thickness of the first semiconductor layer 1041 is 300 Å, 400 Å, 500 Å, 600 Å, 700 Å, or 800 Å.

A thickness of the first source and drain electrode layer 1051 ranges from 300 Å to 800 Å, specifically, the thickness of the first source and drain electrode layer 1051 is 300 Å, 400 Å, 500 Å, 600 Å, 700 Å, or 800 Å.

The first source and drain electrode layer 1051 is disposed in an orthographic projection region of the first semiconductor layer 1041 projected on the first surface 101a, and a covered area of the first source and drain electrode layer 1051 is less than a covered area of the first semiconductor layer 1041. Since there is no gate insulating layer in the structure of the photosensitive PN junction 10a, the covered area of the first semiconductor layer 1041 is set to be slightly larger than the covered area of the first source and drain electrode layer 1051, which can prevent a short circuit of the device caused between first source and drain electrode layer 1051 and the gate electrode layer 102.

The thin film transistor 10b is a thin film transistor with a bottom gate structure, such as a back channel etch (BCE) thin film transistor (TFT). A process of the BCE TFT structure is simple, has low production cost and low contact resistance, and has high mobility, high stability, and high compatibility. BCE TFT can also reduce backlight shading and reduce power consumption.

The thin film transistor 10b also includes a gate electrode insulating layer 103, a second semiconductor layer 1042, and a second source and drain electrode layer 1052. The gate electrode insulating layer 103 is disposed on a side of the second portion 1022 away from the first surface 101a and extends to the first surface 101a, the second semiconductor layer 1042 partly covers a side of the gate electrode insulating layer 103 away from the second portion 1022, the second source and drain electrode layer 1052 partly covers a side of the second semiconductor layer 1042 away from the gate electrode insulating layer 103 and extends to the gate electrode insulating layer 103, and a first through hole 1052c is defined in the second source and drain electrode layer 1052 covering the second semiconductor layer 1042.

The gate electrode insulating layer 103 can be a single layer structure or a multi-layer structure, and the gate electrode insulating layer 103 is made of one or a group selected from silicon oxygen compound and silicon nitrogen compound. For example, in the multi-layer structure of the gate electrode insulating layer 103, the multi-layer structure can be combined by a layer of silicon oxygen compound and a layer of silicon nitrogen compound. A thickness of the gate electrode insulating layer 103 ranges from 1500 Å to 4000 Å. Specifically, the thickness of the gate electrode insulating layer 103 is 1500 Å, 2000 Å, 2500 Å, 3000 Å, 3500 Å, or 4000 Å.

Materials and thicknesses of the second semiconductor layer 1042 and the first semiconductor layer 1041 are the same. Materials and thicknesses of the second source and drain electrode layer 1052 and the first source and drain electrode layer 1051 are the same.

Figure 3:
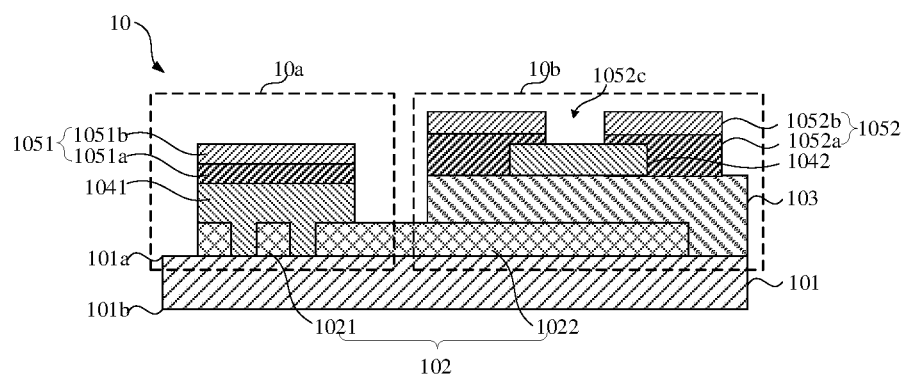
FIG. 3 is a second film layer structural schematic of a sensor module according to the present application.

Referring to FIG. 3, FIG. 3 is a second film layer structural schematic of a sensor module according to the present application. The first source and drain electrode layer 1051 includes a first P-type material layer 1051a and a first electrode material layer 1051b. The first P-type material layer 1051a is disposed at a side near the first semiconductor layer 1041. The first electrode material layer 1051b is disposed at a side far away from the first semiconductor layer 1041. The first P-type material layer 1051a is made of one of a group selected from molybdenum oxide and tin oxide. The first electrode material layer 1051b is made of metal or metal oxide. The second source and drain electrode layer 1052 includes a second P-type material layer 1052a and a second electrode material layer 1052b. The second P-type material layer 1052a is disposed at a side near the second semiconductor layer 1042. The second electrode material layer 1052b is disposed at a side away from the second semiconductor layer 1042. The second P-type material layer 1052a is made of one or a group selected from molybdenum oxide and tin oxide. The second electrode material layer 1052b is made of metal or metal oxide. Specifically, the first electrode material layer 1051b and the second electrode material layer 1052b can be made of copper (Cu), molybdenum (Mo), or molybdenum oxide (MoOx).

The second source and drain electrode layer 1052 is also formed by a P-type material layer to make the second source and drain electrode layer 1052 and the first source and drain electrode layer 1051 manufactured by one step process, thereby saving equipment cost and material costs, saving production time, and improving production efficiency. Moreover, since the gate electrode insulating layer 103 is provided in the thin film transistor 10b, the P-type material formed on the bottom layer of the second source and drain electrode layer 1052 will not affect the thin film transistor 10b.

Figure 4:
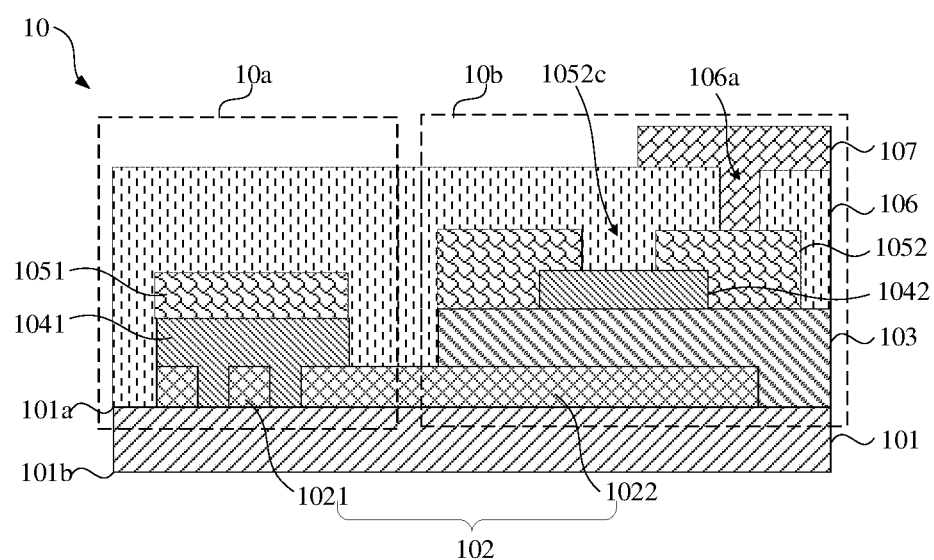
FIG. 4 is a third film layer structural schematic of a sensor module according to the present application.

Referring to FIG. 4, FIG. 4 is a third film layer structural schematic of a sensor module according to the present application. The difference between the film structure of the sensor assembly 10 shown in FIG. 4 and the film structure of the sensor assembly 10 in the two embodiments of FIGS. 1 and 3 is that: the sensor module 10 also includes a passivation layer 106 and a pixel electrode layer 107. The passivation layer covers the light-sensitive PN junction 10a and the thin film transistor 10b, and extends to the first surface 101a. The passivation layer 106 is connected to the second semiconductor layer 1042 through the first through hole 1052c. A second through hole 106a is defined in the passivation layer 106. The pixel electrode layer 107 partially covers a side of the passivation layer 106 away from the first surface 101a, and is connected to the second source and drain electrode layer 1052 through the second through hole 106a.

The passivation layer 106 is can be a single layer structure or a multi-layer structure, and the passivation layer 106 is made of one or a group selected from silicon oxygen compound and silicon nitrogen compound. For example, in the multi-layer structure of the passivation layer 106, the multi-layer structure can be combined by a layer of silicon oxygen compound and a layer of silicon nitrogen compound. A thickness of the passivation layer 106 ranges from 100 Å to 2000 Å. Specifically, the thickness of the passivation layer 106 is 100 Å, 500 Å, 100 Å, 1500 Å, 2000 Å, or 4000 Å.

Figure 5:
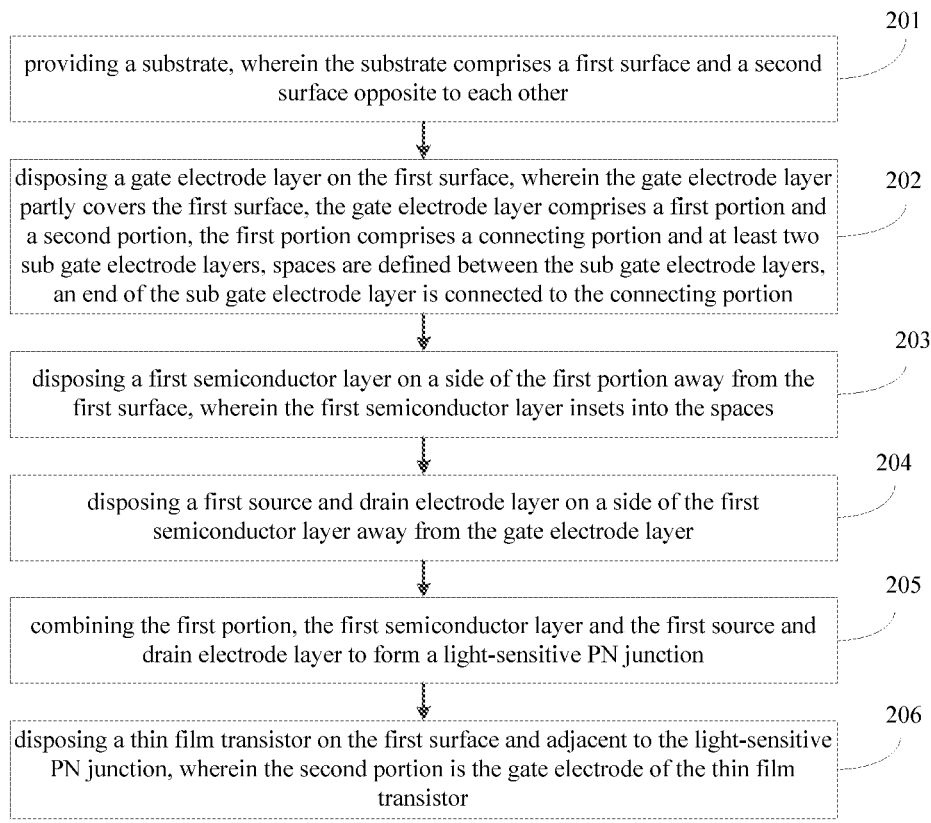
FIG. 5 is a flow chart of a first process embodiment of a method for manufacturing a sensor module according to the present application.
Figure 6:
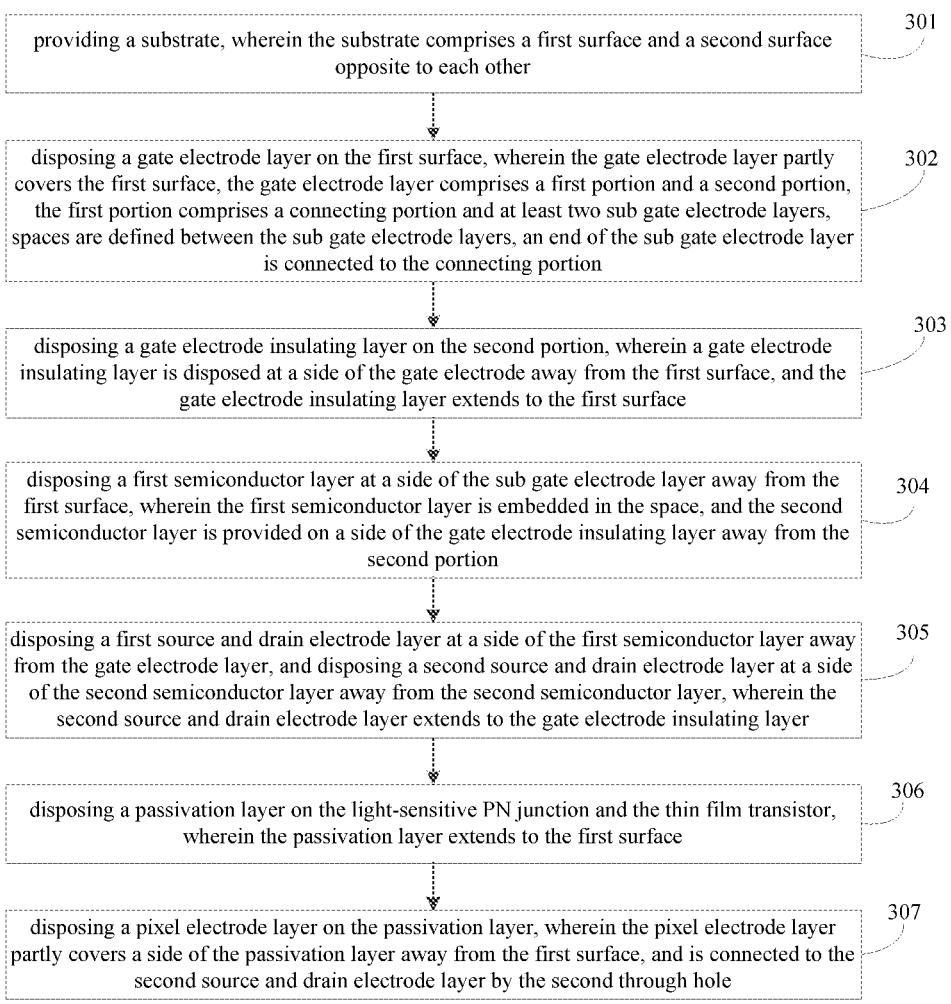
FIG. 6 is a flow chart of a second process embodiment of the method for manufacturing the sensor module according to the present application.

Referring to FIG. 5, FIG. 5 is a flow chart of a first process embodiment of a method for manufacturing a sensor module according to the present application. The present application provides a method for manufacturing the sensor module, which include steps as follows:

A step 201 of providing a substrate, wherein the substrate comprises a first surface and a second surface opposite to each other.

A step 202 of disposing a gate electrode layer on the first surface, wherein the gate electrode layer partly covers the first surface, the gate electrode layer comprises a first portion and a second portion, the first portion comprises a connecting portion and at least two sub gate electrode layers, spaces are defined between the sub gate electrode layers, and an end of the sub gate electrode layer is connected to the connecting portion.

Specifically, a gate electrode film layer is formed on the first surface by a deposition process, then the gate electrode film layer undergoes a yellow light process and an etching process to form at least two sub gate electrode layers with a space, a connecting portion, and a patterned gate electrode film layer. An end of the sub gate electrode layer is connected to the connecting portion, the sub gate electrode layer and the connecting portion are combined to form a first portion, and the patterned gate electrode film layer forms a second portion. The first portion and the second portion are combined to form the gate electrode layer. The deposition process is fast, the film is dense, and the adhesion is good, which is very suitable for large-scale, high-efficiency industrial production. Further, physical vapor deposition can be used to deposit the gate electrode layer.

A step 203 of disposing a first semiconductor layer on a side of the first portion away from the first surface, wherein the first semiconductor layer insets into the spaces.

Specifically, a semiconductor film layer is deposited on the gate electrode layer by a deposition process, and the semiconductor film layer is embedded in the space. Then the semiconductor film layer undergoes an annealing treatment at a preset annealing temperature, and the semiconductor film layer undergoes a yellow light process and an etching process after the annealing treatment, leaving just the semiconductor film layer disposed on the sub gate electrode layer, thereby forming the first semiconductor layer. Specifically, physical vapor deposition can be used to deposit the first semiconductor layer, and the preset annealing temperature is 150° C. to 450° C. Furthermore, the preset annealing temperature is 150° C., 200° C., 300° C., 400° C., or 450° C.

A step 204 of disposing a first source and drain electrode layer on a side of the first semiconductor layer away from the gate electrode layer.

Specifically, a source and drain electrode film layer is deposited on the first semiconductor layer by a deposition process, and the source and drain electrode film layer undergoes a yellow light process and an etching process, leaving just the source and drain electrode film layer disposed on the first semiconductor layer, thereby forming the first source and drain electrode layer. Specifically, physical vapor deposition can be used to deposit the first source and drain electrode layer.

A step 205 of combining the first portion, the first semiconductor layer, and the first source and drain electrode layer to form a light-sensitive PN junction.

A step 206 of disposing a thin film transistor on the first surface and adjacent to the light-sensitive PN junction, wherein the second portion is the gate electrode of the thin film transistor.

Specifically, a gate electrode insulating layer is disposed on a side of the second portion away from the first surface, wherein the gate electrode insulating layer extends to the first surface. When the first semiconductor layer is disposed on the side of the first portion away from the first surface, a second semiconductor layer is disposed on a side of the gate electrode insulating layer away from the second portion. When the first source and drain electrode layer is disposed on the side of the first semiconductor layer away from the gate electrode layer, the second source and drain electrode layer is disposed on a side of the second semiconductor layer away from the gate electrode insulating layer, and the second source and drain electrode layer extends to the gate electrode insulating layer. The second portion, the gate electrode insulating layer, the second semiconductor layer, and the second source and drain electrode layer are combined to form the thin film transistor.

This embodiment provides a method for manufacturing a thin film transistor with a BCE structure, but not as a limitation to the present application. The integration method provided by the present application is also applicable to thin film transistors with other bottom gate structures, specifically a method for manufacturing the thin film transistor is a technical means well-known to those skilled in the art, and will not be repeated here.

Referring to FIGS. 6-12, FIG. 6 is a flow chart of a second process embodiment of the method for manufacturing the sensor module according to the present application. FIGS. 7-12 are step schematics of the method for manufacturing the sensor module according to the present application. The present application provides the method for manufacturing the sensor module, which includes steps as follows:

A step 301 of providing a substrate, wherein the substrate comprises a first surface and a second surface opposite to each other.

A step 302 of disposing a gate electrode layer on the first surface, wherein the gate electrode layer partly covers the first surface, the gate electrode layer comprises a first portion and a second portion, the first portion comprises a connecting portion and at least two sub gate electrode layers, spaces are defined between the sub gate electrode layers, and an end of the sub gate electrode layer is connected to the connecting portion.

Figure 7:
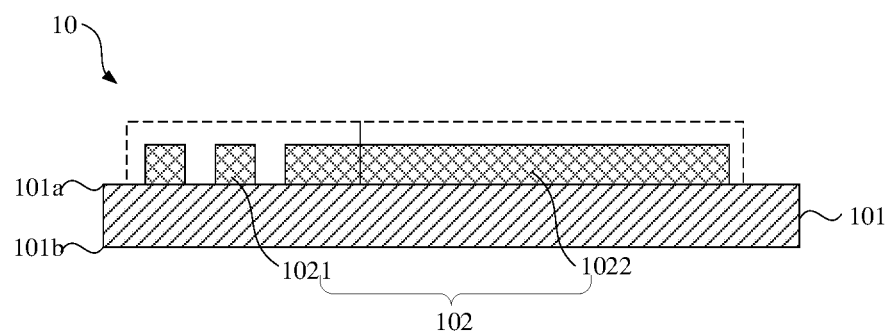
FIGS. 7-12 are step schematics of the method for manufacturing the sensor module according to the present application.

Referring to FIG. 7, FIG. 7 is a step schematic of forming the gate electrode layer of the present application. In one embodiment, physical vapor deposition (PVD) is used to deposit the gate electrode film layer with a thickness ranging from 3000 Å to 8000 Å, and using a yellow light process and an etching process in turn to manufacture a patterned gate electrode layer 102, and the light sensor (the light-sensitive PN junction of the present application) undergoes a hollowout process to form two or more sub gate electrode gate layers connected to each other to form the first portion 1021 of FIG. 7.

A step 303 of disposing a gate electrode insulating layer on the second portion, wherein a gate electrode insulating layer is disposed at a side of the gate electrode away from the first surface, and the gate electrode insulating layer extends to the first surface.

Figure 8:
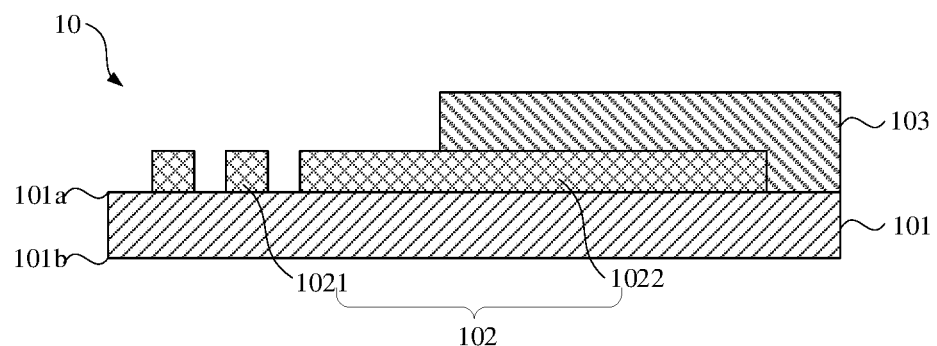

Referring to FIG. 8, FIG. 8 is a step schematic of forming the gate electrode insulating layer of the present application. In one embodiment, a plasma enhanced chemical vapor deposition process is used to deposit the gate electrode insulating layer, and it is then patterned by a yellow light process and an etching process, leaving the gate electrode insulating layer 103 partly covering the second portion 1022, and the gate electrode insulating layer 103 extends to the first surface 101*a*.

A step 304 of disposing a first semiconductor layer at a side of the sub gate electrode layer away from the first surface, wherein the first semiconductor layer is embedded in the space, and the second semiconductor layer is provided on a side of the gate electrode insulating layer away from the second portion.

Figure 9:
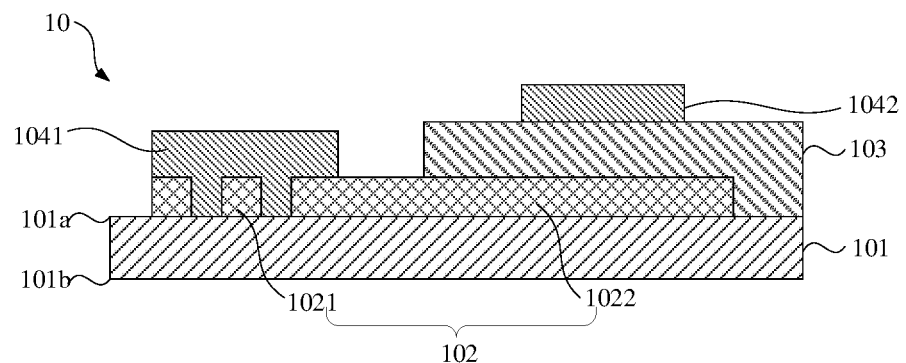

Referring to FIG. 9, FIG. 9 is a step schematic of forming the first semiconductor layer and the second semiconductor layer of the present application. In one embodiment, physical vapor deposition (PVD) is used to deposit indium gallium zinc oxide (IGZO) material with a thickness ranging from 300 Å to 800 Å, and the IGZO material undergoes an annealing treatment, a preset annealing temperature is 150° C. to 450° C., and then a patterned semiconductor layer is obtained by a yellow light process and an etching process, the IGZO material left on the first portion 1021 is the first semiconductor layer 1041, and the IGZO material left on the gate electrode insulating layer 103 is the second semiconductor layer 1042.

A step 305 of disposing a first source and drain electrode layer at a side of the first semiconductor layer away from the gate electrode layer, and disposing a second source and drain electrode layer at a side of the second semiconductor layer away from the second semiconductor layer, wherein the second source and drain electrode layer extends to the gate electrode insulating layer.

Figure 10:
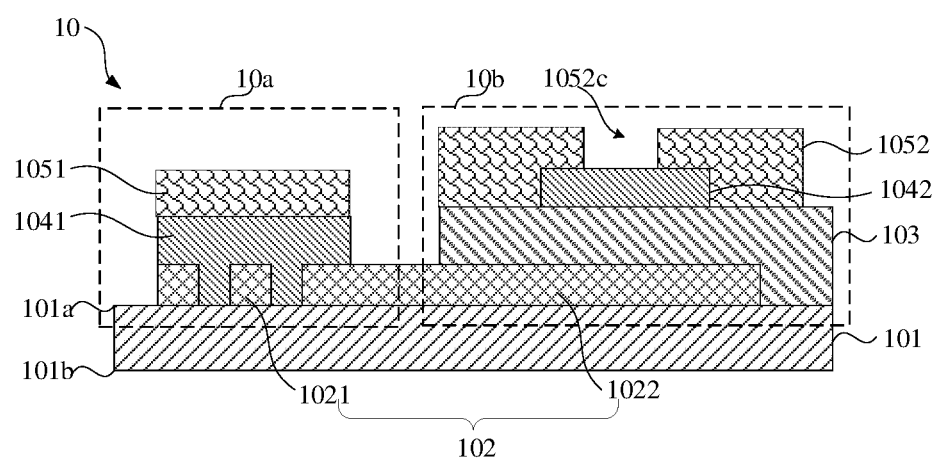

Referring to FIG. 10, FIG. 10 is a step schematic of forming the first source and drain electrode layer and the second source and drain electrode layer of the present application. In one embodiment, physical vapor deposition (PVD) is used to deposit a source and drain electrode film layer with a thickness ranging from 300 Å to 800 Å. Wherein a layer of a P-type material is deposited firstly, such as molybdenum oxide or tin oxide, then a metal electrode material is deposited on the P-type material. After the deposition is completed, the yellow light process is performed. The metal electrode material left on the first semiconductor layer 1041 is the first source and drain electrode layer 1051, and the metal electrode material left on the second semiconductor layer 1042 and extending to the gate electrode insulating layer 103 is the second source and drain electrode layer 1052, and a first through hole 1052*c* is defined in the second source and drain electrode layer 1052. In addition, the specific structure of the thin film transistor 10*b* can be set according to specific device requirements. The present application provides only an example, and is not intended as limitations to the structure of the transistor 10*b* of the present application.

A step 306 of disposing a passivation layer on the light-sensitive PN junction and the thin film transistor, wherein the passivation layer extends to the first surface.

Figure 11:
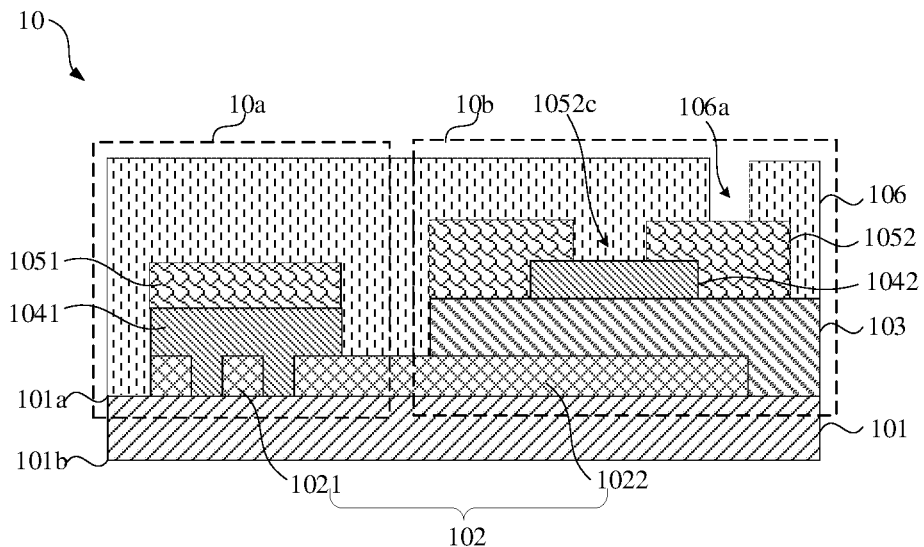

Referring to FIG. 11, FIG. 11 is a step schematic of forming the passivation layer of the present application. In one embodiment, a plasma enhanced chemical vapor deposition process is used to deposit the passivation layer with a thickness ranging from 100 Å to 2000 Å, and a second through hole 106*a* is defined by a yellow light process and an etching process in turn. The passivation layer is connected to the second semiconductor layer 1042 through the first through hole 1052*c* of the second source and drain electrode layer 1052, and isolates two parts of the second source and drain electrode layer 1052, namely the source electrode and the drain electrode (not distinguished in the figures).

A step 307 of disposing a pixel electrode layer on the passivation layer, wherein the pixel electrode layer partly covers a side of the passivation layer away from the first surface, and is connected to the second source and drain electrode layer by the second through hole 106*a*.

Figure 12:
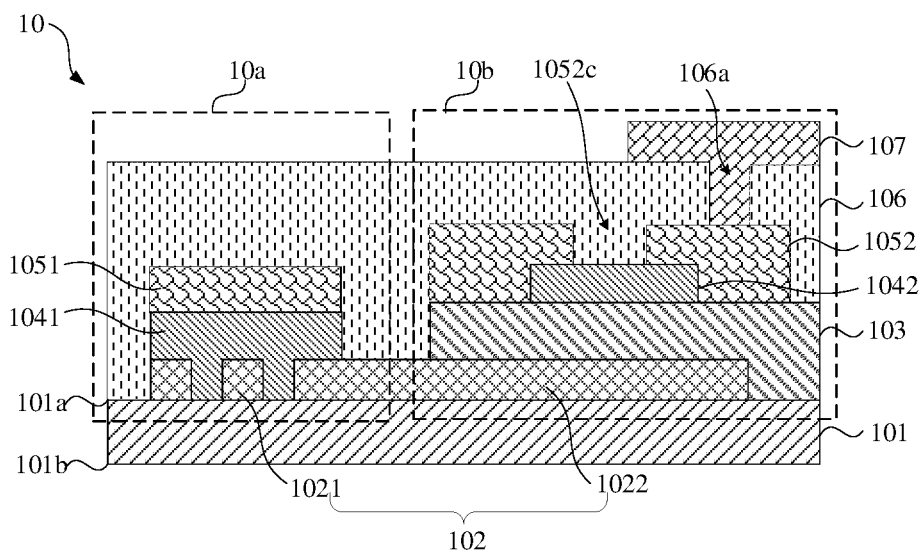

Referring to FIG. 12, FIG. 12 is a step schematic of forming the pixel electrode layer of the present application. After the passivation layer is disposed on the pixel electrode layer 107, a sensor module 10 of FIG. 12 is formed.

Figure 13:
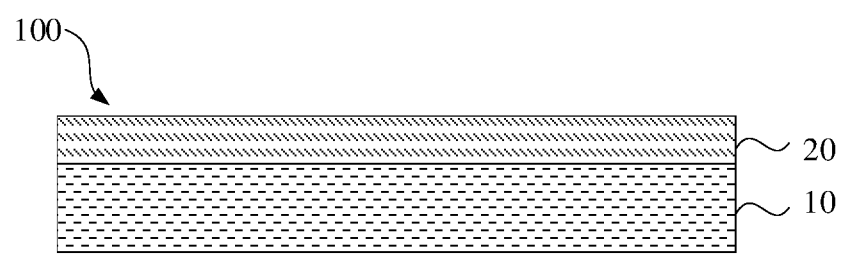
FIG. 13 is a structural schematic of a display panel according to the present application.

The present application further provides a display panel 100. FIG. 13 is a structural schematic of the display panel 100 according to the present application. The display panel 100 includes the sensor module 10 of the above and a light emitting module 20. The display panel 100 also can include other devices. The light emitting module 20 and other devices and their assembly in the present application are related technologies well known to those skilled in the art, and will not be repeated here.

The display panel 100 provided by the present application integrates a light-sensitive PN junction and a thin-film transistor with a bottom gate structure. Because the light-sensitive PN junction is used to replace the photo thin film transistor (photo TFT) and the signal thin film transistor (amp TFT) in the traditional structure to reduce one thin film transistor, therefore, the device structure is simplified, the layout space in the pixel structure is saved, and the aperture ratio is increased. It can also prevent the limitation of the integration of the top-gate structure thin film transistor photosensitive sensor, and solve the problem of increasing module thickness and development cost when the bottom-illuminated photosensitive sensor is integrated with the display panel. The display panel 100 provided by the present application can develop and apply multiple functions such as light sensing writing, infrared touch, distance sensing, and remote light interaction.

The sensor module, the method for manufacturing the sensor module, and the display panel provided by the present application are described in detail above. Specific examples are used in this article to illustrate the principle and implementation of the present invention. The description of the above embodiments is only for helping to understand the present application. At the same time, for those skilled in the art, according to the ideas of the present invention, there will be changes in the specific implementation and the scope of application. In summary, the content of this specification should not be construed as a limitation of the present invention.

What is claimed is:

1. A sensor module, comprising:
    a substrate, wherein the substrate comprises a first surface and a second surface opposite to each other;

a gate electrode layer, wherein the gate electrode layer partly covers the first surface, the gate electrode layer comprises a first portion and a second portion, the first portion comprises a connecting portion and at least two sub gate electrode layers, spaces are defined between the sub gate electrode layers, and an end of the sub gate electrode layers is connected to the connecting portion;

a first semiconductor layer, wherein the first semiconductor layer is disposed on a side of the first portion away from the first surface and insets into the spaces;

a first source and drain electrode layer, wherein the first source and drain electrode layer is disposed on a side of the first semiconductor layer away from the gate electrode layer, and the first portion, the first semiconductor layer, and the first source and drain electrode layer are combined to form a light-sensitive PN junction; and a thin film transistor, wherein the thin film transistor and the light-sensitive PN junction are disposed on the first surface and adjacent to each other, and the second portion is a gate electrode of the thin film transistor;

wherein the thin film transistor further comprises a gate electrode insulating layer, a second semiconductor layer, and a second source and drain electrode layer, the gate electrode insulating layer is disposed on a side of the second portion away from the first surface and extends to the first surface, the second semiconductor layer partly covers a side of the gate electrode insulating layer away from the second portion, the second source and drain electrode layer partly covers a side of the second semiconductor layer away from the gate electrode insulating layer and extends to the gate electrode insulating layer, and a first through hole is defined in the second source and drain electrode layer covering the second semiconductor layer; and wherein the sensor module further comprises a passivation layer and a pixel electrode layer, the passivation layer covers the light-sensitive PN junction and the thin film transistor, and extends to the first surface.

2. The sensor module of claim 1, wherein the first source and drain electrode layer comprises a first P-type material layer and a first electrode material layer, the first P-type material layer is disposed on a side near the first semiconductor layer, the first electrode material layer is disposed on a side away from the first semiconductor layer, the first P-type material layer is made of one or a group selected from molybdenum oxide and tin oxide, and the first electrode material layer is made of metal or metal oxide.

3. The sensor module of claim 2, wherein a thickness of the first source and drain electrode layer ranges from 300 Å to 800 Å.

4. The sensor module of claim 1, wherein the first source and drain electrode layer is disposed in an orthographic projection region of the first semiconductor layer projected on the first surface, and a covered area of the first source and drain electrode layer is less than a covered area of the first semiconductor layer.

5. The sensor module of claim 1, wherein the gate electrode layer is made of metal or metal alloy, and a thickness of the gate electrode layer ranges from 3000 Å to 8000 Å.

6. The sensor module of claim 1, wherein the first semiconductor layer is made of transparent metal oxide, and a thickness of the first semiconductor layer ranges from 300 Å to 800 Å.

7. The sensor module of claim 1, wherein the second source and drain electrode layer comprises a second P-type material layer and a second electrode material layer, the second P-type material layer is disposed on a side near the second semiconductor layer, and the second electrode material layer is disposed on a side away from the second semiconductor layer.

8. The sensor module of claim 1, wherein the passivation layer is connected to the second semiconductor layer by the first through hole, a second through hole is defined in the passivation layer, the pixel electrode layer partly covers a side of the passivation layer away from the first surface, and is connected to the second source and drain electrode layer by the second through hole.

9. A display panel, comprising a sensor module, wherein the sensor module comprises:

a substrate, wherein the substrate comprises a first surface and a second surface opposite to each other;

a gate electrode layer, wherein the gate electrode layer partly covers the first surface, the gate electrode layer comprises a first portion and a second portion, the first portion comprises a connecting portion and at least two sub gate electrode layers, spaces are defined between the sub gate electrode layers, and an end of the sub gate electrode layers is connected to the connecting portion;

a first semiconductor layer, wherein the first semiconductor layer is disposed on a side of the first portion away from the first surface and insets into the spaces;

a first source and drain electrode layer, wherein the first source and drain electrode layer is disposed on a side of the first semiconductor layer away from the gate electrode layer, and the first portion, the first semiconductor layer, and the first source and drain electrode layer are combined to form a light-sensitive PN junction; and a thin film transistor, wherein the thin film transistor and the light-sensitive PN junction are disposed on the first surface and adjacent to each other, and the second portion is a gate electrode of the thin film transistor;

wherein the thin film transistor further comprises a gate electrode insulating layer, a second semiconductor layer, and a second source and drain electrode layer, the gate electrode insulating layer is disposed on a side of the second portion away from the first surface and extends to the first surface, the second semiconductor layer partly covers a side of the gate electrode insulating layer away from the second portion, the second source and drain electrode layer partly covers a side of the second semiconductor layer away from the gate electrode insulating layer and extends to the gate electrode insulating layer, and a first through hole is defined in the second source and drain electrode layer covering the second semiconductor layer; and wherein the sensor module further comprises a passivation layer and a pixel electrode layer, the passivation layer covers the light-sensitive PN junction and the thin film transistor, and extends to the first surface.

10. The display panel of claim 9, wherein the first source and drain electrode layer comprises a first P-type material layer and a first electrode material layer, the first P-type material layer is disposed on a side near the first semiconductor layer, the first electrode material layer is disposed on a side away from the first semiconductor layer, the first P-type material layer is made of one or a group selected from molybdenum oxide and tin oxide, and the first electrode material layer is made of metal or metal oxide.

11. The display panel of claim 10, wherein a thickness of the first source and drain electrode layer ranges from 300 Å to 800 Å.

12. The display panel of claim 9, wherein the first source and drain electrode layer is disposed in an orthographic projection region of the first semiconductor layer projected on the first surface, and a covered area of the first source and drain electrode layer is less than a covered area of the first semiconductor layer.

13. The display panel of claim 9, wherein the gate electrode layer is made of metal or metal alloy, and a thickness of the gate electrode layer ranges from 3000 Å to 8000 Å.

14. The display panel of claim 9, wherein the second source and drain electrode layer comprises a second P-type material layer and a second electrode material layer, the second P-type material layer is disposed on a side near the second semiconductor layer, and the second electrode material layer is disposed on a side away from the second semiconductor layer.

15. The display panel of claim 9, wherein the passivation layer is connected to the second semiconductor layer by the first through hole, a second through hole is defined in the passivation layer, the pixel electrode layer partly covers a side of the passivation layer away from the first surface, and is connected to the second source and drain electrode layer by the second through hole.

\* \* \* \* \*